US007186625B2

(12) United States Patent
Chudzik et al.

(10) Patent No.: US 7,186,625 B2
(45) Date of Patent: Mar. 6, 2007

(54) HIGH DENSITY MIMCAP WITH A UNIT REPEATABLE STRUCTURE

(75) Inventors: Michael P. Chudzik, Beacon, NY (US); Louis L. Hsu, Fishkill, NY (US); Joseph F. Shepard, Jr., Fishkill, NY (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 258 days.

(21) Appl. No.: 10/709,768

(22) Filed: May 27, 2004

(65) Prior Publication Data

US 2005/0266652 A1    Dec. 1, 2005

(51) Int. Cl.
*H01L 21/20* (2006.01)
(52) U.S. Cl. .............. 438/387; 438/386; 438/397; 257/E21.047
(58) Field of Classification Search ........... 438/301, 438/243, 306
See application file for complete search history.

(56) References Cited

U.S. PATENT DOCUMENTS

| | | | |
|---|---|---|---|
| 5,583,359 A | 12/1996 | Ng et al. | |
| 5,821,827 A | 10/1998 | Mohwinkel et al. | |
| 6,251,740 B1 | 6/2001 | Johnson et al. | |
| 6,362,012 B1* | 3/2002 | Chi et al. | 438/3 |
| 6,417,535 B1 | 7/2002 | Johnson et al. | |
| 6,441,419 B1 | 8/2002 | Johnson et al. | |
| 6,528,842 B1 | 3/2003 | Luich et al. | |
| 6,559,004 B1 | 5/2003 | Yang et al. | |
| 6,580,111 B2 | 6/2003 | Kim et al. | |
| 6,686,620 B2* | 2/2004 | An et al. | 257/301 |
| 6,720,598 B1* | 4/2004 | Wohlfahrt | 257/295 |
| 6,762,107 B2* | 7/2004 | Watanabe et al. | 438/393 |
| 6,794,726 B2* | 9/2004 | Radens et al. | 257/530 |

* cited by examiner

*Primary Examiner*—Michael Lebentritt
*Assistant Examiner*—Elias Ullah
(74) *Attorney, Agent, or Firm*—Anthony J. Canale; Greenblum & Bernstein, P.L.C.

(57) ABSTRACT

A structure, apparatus and method for utilizing vertically interdigitated electrodes serves to increase the capacitor area surface while maintaining a minimal horizontal foot print. Since capacitance is proportional to the surface area the structure enables continual use of current dielectric materials such as $Si_3N_4$ at current thicknesses. In a second embodiment of the interdigitated MIMCAP structure the electrodes are formed in a spiral fashion which serves to increase the physical strength of the MIMCAP. Also included is a spiral shaped capacitor electrode which lends itself to modular design by offering a wide range of discrete capacitive values easily specified by the circuit designer.

16 Claims, 12 Drawing Sheets

HIGH DENSITY MIMCAP WITH A UNIT REPEATABLE STRUCTURE

BACKGROUND OF INVENTION

1. Field of the Invention

The invention relates to metal-insulator-metal capacitors, and more particularly to a metal-insulator-metal capacitor structure and method of manufacturing a high density of metal-insulator-metal capacitors in a VLSI circuit.

2. Background Description

Metal-insulator-metal capacitors (MIMCAP) are important components in memory, logic and analog circuits. MIMCAPs are typically fabricated with metal interconnections and do not utilize valuable silicon real estate. In contrast, a conventional silicon based diffusion capacitor suffers from poor efficiency as internal serial resistance increases, adding an unwanted resistance-capacitance intrinsic delay to the capacitor.

Horizontal Plate MIMCAP structures having a planar design have been introduced into integrated circuits in the back-end-of-line (BEOL) manufacturing steps. Such BEOL designs require dielectric materials with low processing temperatures to avoid damaging previously fabricated structures on the silicon chip. These dielectric materials typically include silicon oxide ($SiO_2$) or silicon nitride ($Si_3N_4$) deposited using plasma enhanced chemical vapor deposition (PECVD) with capacitance densities on the order of 1–1.5 $fF/um^2$. Thus, horizontal plate capacitor structures demand large silicon chip area to form capacitors of needed capacitance.

Figure 1:
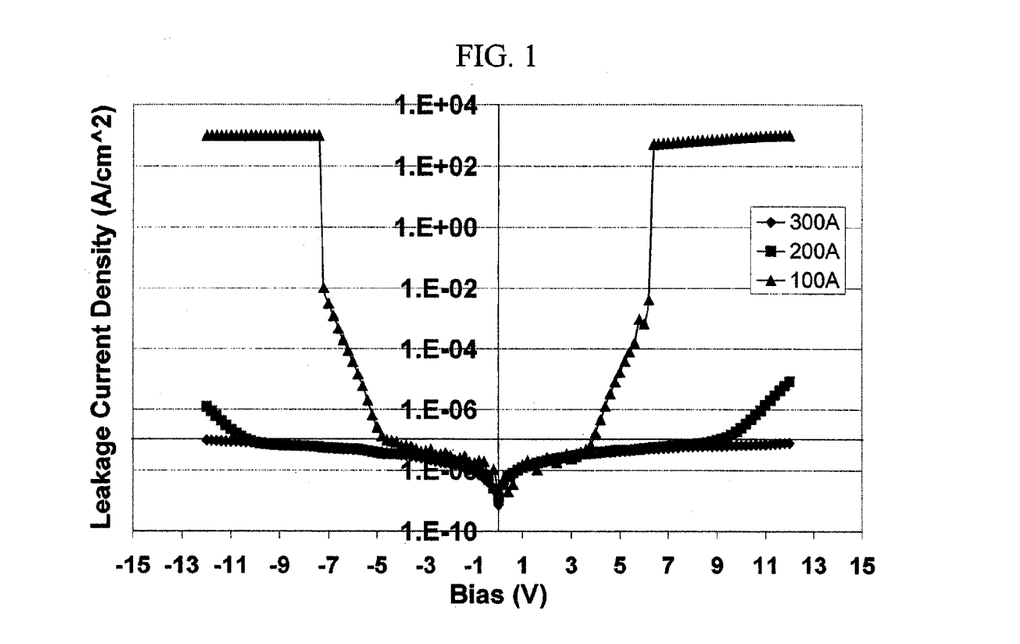
FIG. 1 is a graph of leakage current versus bias voltage for a capacitor.
Figure 2:
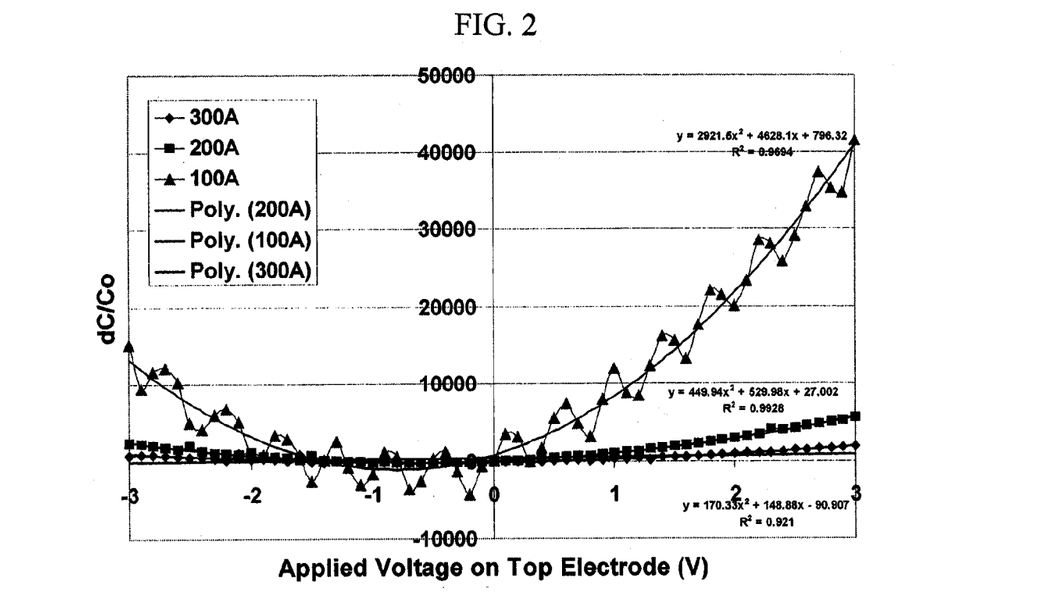
FIG. 2 is a graph of capacitance non linearity versus voltage for various insulator thicknesses.
Figure 3:
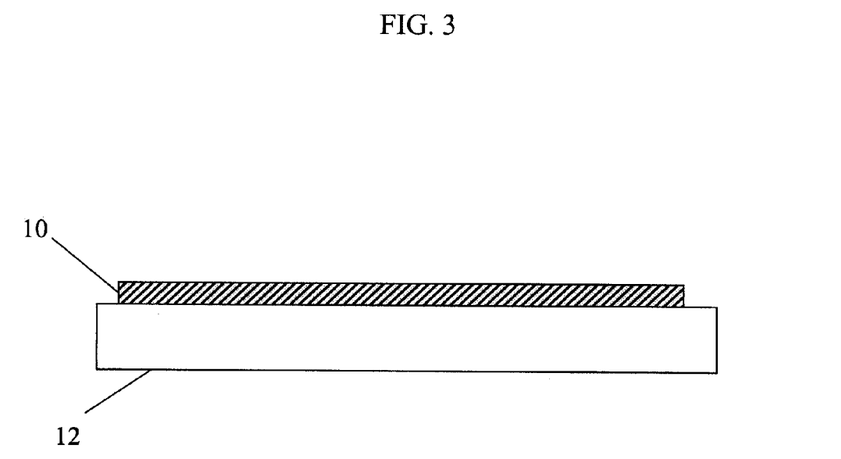
FIGS. 3–11 illustrate steps in fabricating a vertical MIMCAP in accordance with the invention.

The continual shrinking of VLSI circuits requires reducing the planar area allocated to horizontal plate MIMCAPS on the silicon chip while the capacitance requirements are maintained. One way of reducing planar area requirements while maintaining the necessary capacitance includes decreasing insulator thickness between the capacitor plates. However, insulator thickness scaling of the current materials has reached a design road block because of the exponential increase in leakage currents, increase in the voltage linearity, and reduction in lifetime reliability which are a consequence of thinner insulating films. For example, FIGS. 1 and 2 show the increase in leakage currents and voltage/capacitance non-linearity, respectively, as a function of insulator thinning. FIG. 1 shows leakage current increasing along the y-axis as bias voltage increases along the x-axis. The relationship becomes increasingly non-linear at thinner insulating film thicknesses. FIG. 2 shows an increasingly non-linear relationship between capacitance on the y-axis and voltage on the x-axis for thinner insulators. At reduced thicknesses, the capacitance/voltage relationship becomes sufficiently non-linear as to require more complicated circuit designs.

One method to conserve surface area is to build capacitors in the vertical dimension. Some vertical designs take advantage of a deep trench structure formed in the silicon chip including forming the MIMCAP on the sidewalls and the bottoms of the trench. Such trenches are formed in the BEOL due to the constraints of low-temperature metal processing. In other words, the MIMCAP must be formed towards the end of the fabrication process to avoid damage to the MIMCAP structure during subsequent processing steps. Other designs avoid MIMCAP damage during fabrication by forming deep trenches in the silicon substrate and using a metal with a high melting temperature such as tungsten, or doped polysilicon to form electrodes. Such high-melting temperature metals will successfully survive any subsequent processing steps.

However, deep trench structure MIMCAPs result in high processing costs. Therefore, other types of vertical MIMCAP designs have been proposed. For example, one MIMCAP design of reduced costs includes etching insulating material in the BEOL to form a shallow-trench structure so that surface area available for capacitor plate formation is increased without increasing real estate usage on the silicon chip surface. By forming the capacitor plates along the surfaces of the shallow-trenches, a structure having a so called semi-interdigitated MIMCAP may be formed. The semi-interdigitated design increases the surface area of the global charge capacitive plates significantly with little increase in chip surface area usage.

It is also known that some MIMCAP designs, especially those of a vertical MIMCAP structure, require many extra processing steps that are typically not easily integratable into a conventional BEOL process. For example, the semi-interdigitated MIMCAP design described above does not allow all the nodes of the capacitive plates to couple to one another at all surfaces. In other words, the surface efficiency or utilized surface area of the capacitive plates is only 50 to 60%. This reduction in utilized area has driven research and development into alternative high dielectric constant (high-k) materials for MIMCAP insulating films such as $Al_2O_3$, $Ta_2O_5$ $HfO_2$ and laminate stacks thereof. Such high-k materials allow for high capacitance values for a given insulator film thickness.

But the introduction of high-k materials requires integrating processing steps into the fabrication process such as reactive ion etching (RIE) to pattern the MIMCAP area. The RIE patterning of these materials is expensive and in some cases requires plasma etching at elevated temperatures and/or a dual step process of plasma or implant damage followed by a wet chemical etch. This subsequently drives up the manufacturing cost of the MIMCAP capacitor. Hafnium oxide ($HfO_2$) is an example of a high-k insulating film candidate which is difficult to etch and thus expensive to incorporate into MIMCAP design.

The invention is designed to solve one or more of the above problems.

SUMMARY OF INVENTION

In a first aspect of the invention, a method of fabricating a capacitor includes forming a bottom electrode and attaching at least one lower surface expansion structure to the bottom electrode. A "surface expansion structure" includes any surface structure configured to increase the surface area in a given footprint available to support a conductive material. Such structure may include a pillar, island, via, mushroom, trench, pit, hole, etc. The method also includes conformally depositing an insulator film to a surface of the bottom electrode and a surface of the at least one surface expansion structure and forming a top electrode approximately parallel to the bottom electrode. Additionally, the method includes attaching at least one upper surface expansion structure to the top electrode adjacent to the at least one lower surface expansion structure and separated from the at least one lower surface expansion structure by the insulator film.

In another aspect of the invention, an embodiment includes a capacitor having at least one lower surface expansion structure and an insulator film conformally disposed on a surface of the at least one lower surface expansion structure. The capacitor also includes at least one upper surface expansion structure disposed adjacent the insulator film and a lower electrical contact in electrical communication with the at least one lower surface expansion structure. Additionally included is an upper electrical contact in electrical communication with the at least one upper surface expansion structure.

In yet another aspect of the invention, an embodiment includes a capacitor having a bottom electrode and a lower electrode fin disposed on the bottom electrode defining a first spiral shape having concentric layers. The embodiment also includes an upper electrode and an upper electrode fin disposed on the upper electrode defining a second spiral shape having concentric layers, wherein the concentric layers of the upper electrode fin are configured to interleave between the concentric layer of the electrode fin. Additionally, the embodiment includes an insulator film conformally disposed between the lower and upper electrode fins.

DETAILED DESCRIPTION

The invention is directed to a "fully interdigitated MIMCAP structure" and method of manufacture. By using the MIMCAP structure and fabricating process, little surface area is being used for the MIMCAP. In embodiments, the invention also achieves substantial vertical surface capacitive coupling, as well as provides improved mechanical strength to the MIMCAP structure. The structure and method maintain the area of the capacitor despite the loss in horizontal real estate on the semiconductor wafer. Additionally, the structure and method is capable of integrating high-k materials that are difficult to etch by enabling the use of chemical-mechanical polishing (CMP) to define the capacitor dielectric area rather than using RIE.

In the method and structure, the MIMCAP device dimension scaling is referred to as a "fully interdigitated MIMCAP structure", e.g., two capacitor node surfaces almost completely coupled to each other mostly in the vertical dimension. The method and structure of MIMCAP also provides a "vertical spiral shape" MIMCAP. MIMCAPs of vertical spiral shape allow MIMCAP modular fabrication with individual spiral rolls having a unit size of a unit capacitance, or multiple spiral rolls with different unit sizes for precision applications.

An example of the steps of forming an embodiment of a fully interdigitated MIMCAP are shown in FIGS. 3–11. In this embodiment, a conductor such as a metal material with low resistance is deposited on a substrate 12 to form a bottom electrode 10. By way of example, the conductor material may be TiN, TaN, Cu, or Ta. The bottom electrode 10 is deposited and patterned on the substrate 12 to form the base electrode of the fully interdigitated MIMCAP, and may be deposited using methods well known in the art such as, for example collimated physical vapor deposition, atomic layer deposition (ALD), or chemical vapor deposition (CVD) or plasma enhanced CVD (PECVD).

Figure 4:
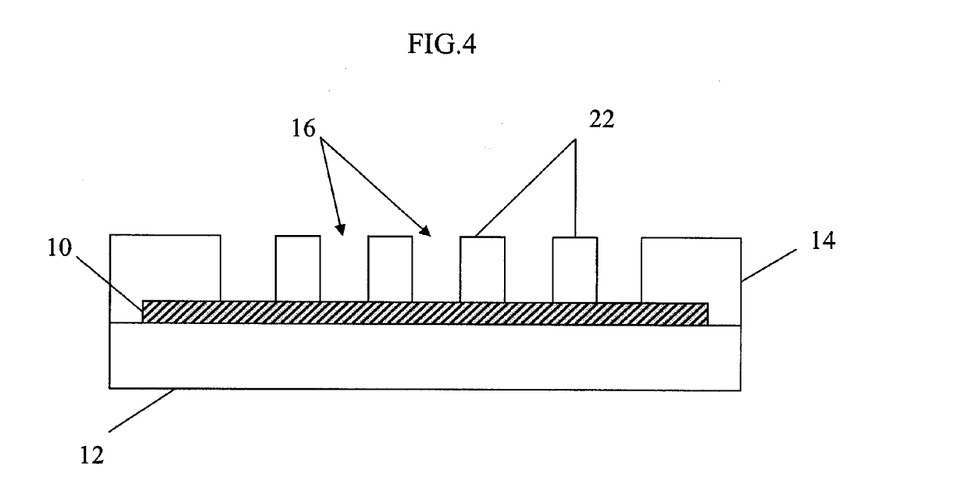

As shown in FIG. 4, an interlayer dielectric (ILD) material 14 such as, for example, $SiO_2$ is deposited and patterned using standard photolithography techniques, such as CVD oxide deposition, resist coating, lithographic patterning and reactive ion etching using $CF_4$ plasma. The ILD layer 14 may be deposited and patterned to form various features, e.g., lines, spaces, cylinder, studs, cones, or the like. Vias 16 are formed in the ILD layer 14 using reactive ion etching (RIE) techniques. The vias 16 may be formed, for example, by conventional lithography, or Dual Tone Resist (DTR), or sidewall image transfer, or through self assembled nanocrystals acting as a mask. The latter three techniques are described as a means to improve upon the MIMCAP area restrictions imposed by photolithography. The formation of vias result in ILD pillars 22 separating or defining the vias 16.

Figure 5:
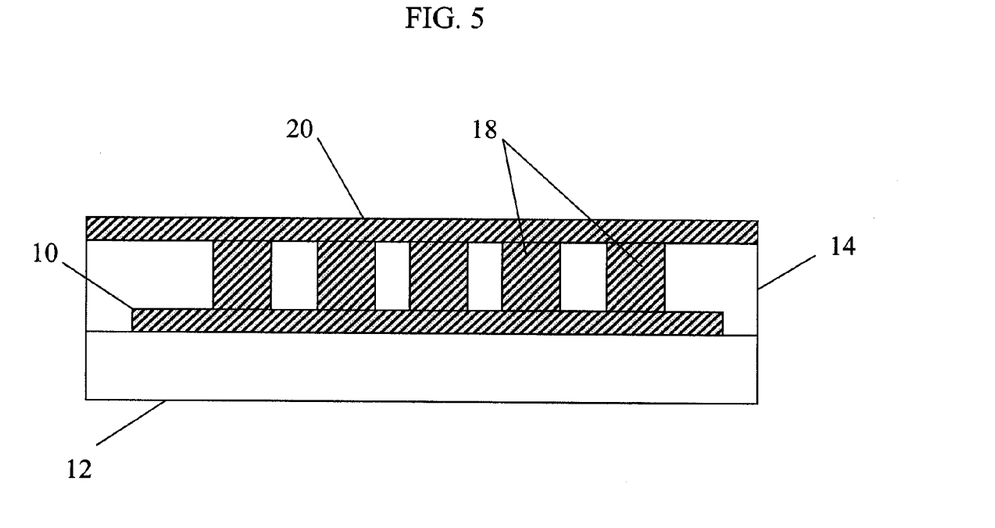

FIG. 5 shows the vias 16 filled with a conductor material which may be the same or similar to the bottom electrode 10 material to form vertical surface expansion structures 18. The vertical surface expansion structures 18 may also be referred to as vertically interdigitated electrodes, and are in electrical communication with the bottom electrode 10. The vertical surface expansion structures 18 are covered by a top conductor layer 20. The vertical surface expansion structures 18 and top conductor 20 may be deposited using methods well known in the art such as collimated physical vapor deposition, atomic layer deposition (ALD), or chemical vapor deposition (CVD) or plasma enhanced CVD (PECVD).

Figure 6:
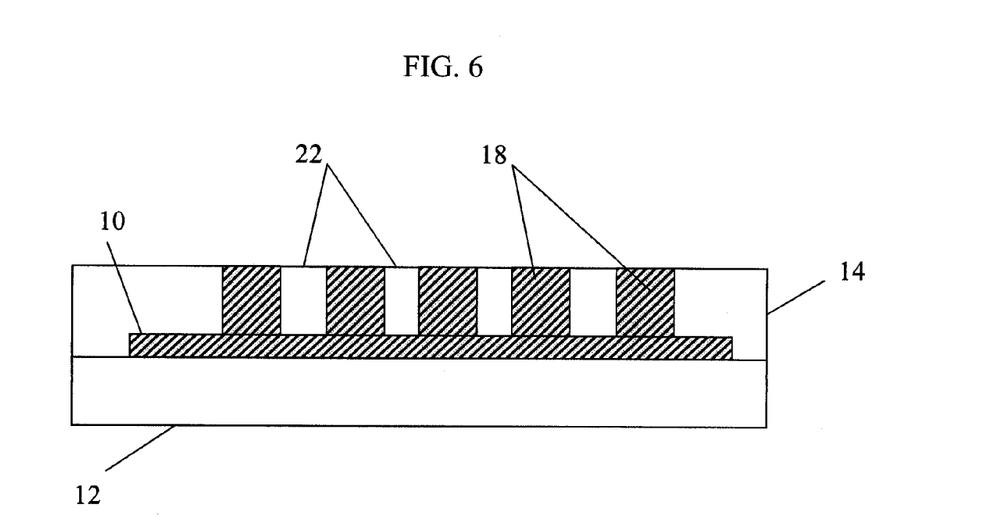

As shown in FIG. 6, chemical-mechanical polishing (CMP), for example, may be used to recess or remove the top conductor layer 20 to a level approximately planar with the top of the ILD 14 and more particularly the ILD pillars 22 formed previously in the etching step. In this process, the chemical-mechanical polish step removes conductor material from above the top surface of the ILD layer 14 and exposes the tops of the vertical surface expansion structures 18.

Figure 7:
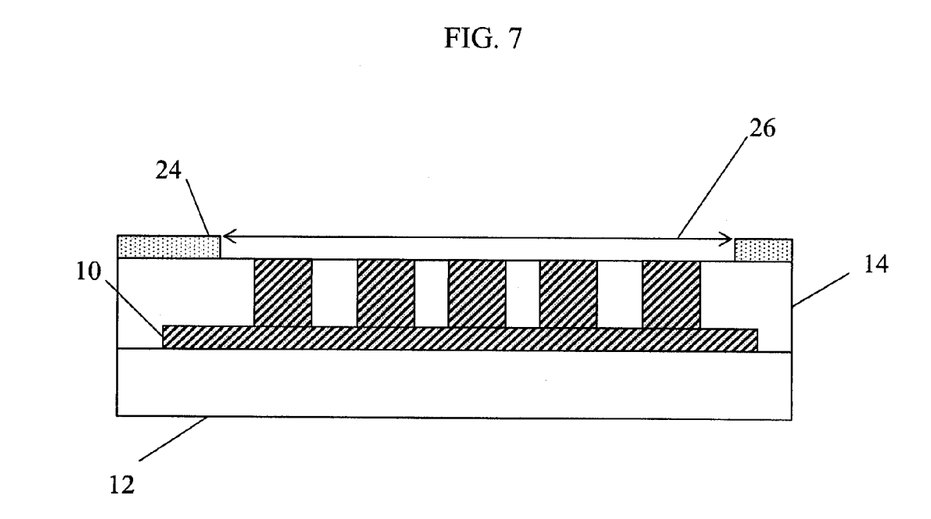

As shown in FIG. 7, in one embodiment, polish stops 24 such as, for example, $Si_3N_4$ may be deposited on top of the ILD 14 to the sides of the lower or vertical surface expansion structures 18. In this manner, photolithography techniques may be used to define the area of the MIMCAP on the silicon wafer. Additionally, a wet chemical etch preferential to the ILD 14 material may be used to define a space or MIMCAP window 26 to the MIMCAP area. As such, the deposited dielectric may also be used as a polish stop.

Figure 8:
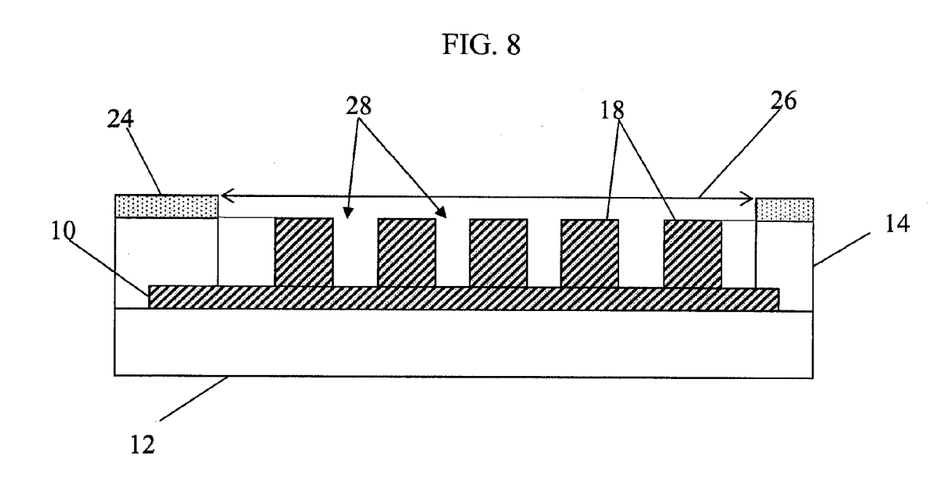

As shown in FIG. 8, a preferential wet chemical or reactive ion etch may be used to remove the exposed ILD pillars 22. That is, the exposed insulating material 14 of the ILD pillars 22 is removed using a differential etch technique thereby exposing the lower surface expansion structures 18. This step exposes and defines the vertically interdigitiated electrodes or lower surface expansion structures 18 which serve to increase the charge collecting surface area of the MIMCAP. Gaps 28 are now provided between the lower surface expansion structures 18. In another implementation, a soft mask material such as resist may be used to define the MIMCAP window 26 prior to a selective etch. Such a mask would be removed after the ILD pillar 22 strip step.

Figure 9:
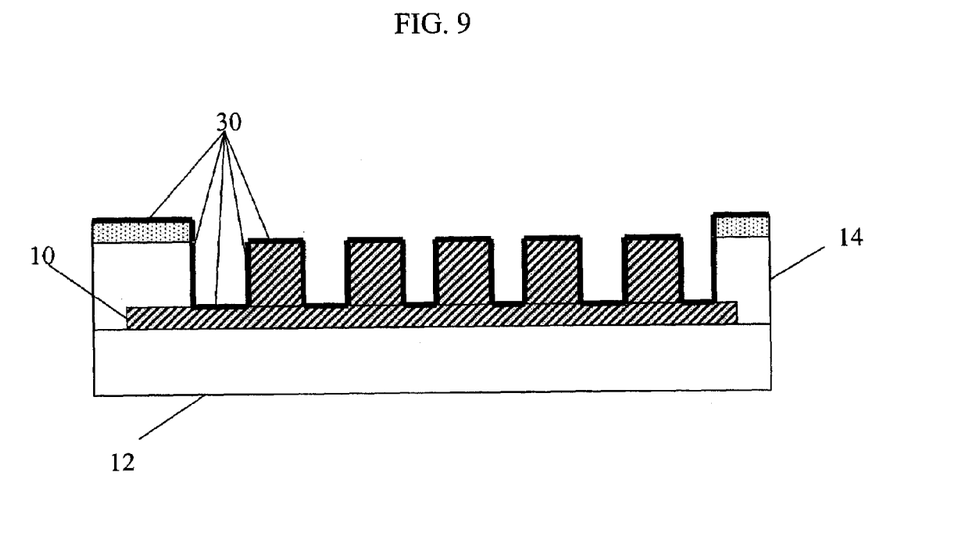

FIG. 9 shows a layer of a dielectric material 30 such as, for example, $Si_3N_4$, $Al_2O_3$, $HfO_2$ and/or laminates thereof, deposited conformally along the exposed surfaces of the vertical surface expansion structures 18 and ILD 14 and polish stops 24 using any number of well known techniques. These techniques may be, for example, ALD and CVD. In this step, the dielectric material 30 forms a conformal thin insulating film about 0.2 to 10 μm high covering the surface expansion structure 18.

It should be noted that the aspect ratio of the surface expansion structure depends on the structure's geometry, fabrication technology, and lithographic resolution. In some cases, the surface expansion structure may cover many metal levels and therefore have a large aspect ratio.

Figure 10:
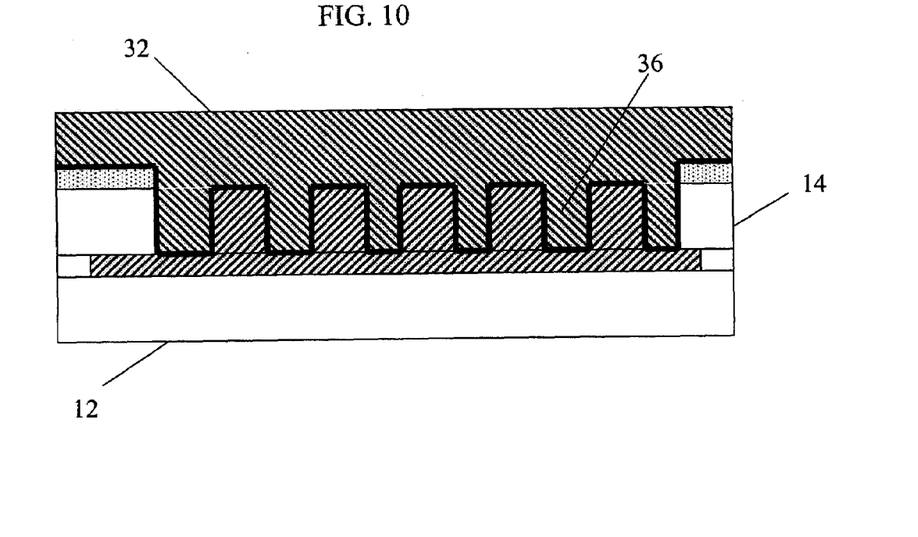

In FIG. 10, a top electrode material 32 is deposited on the dielectric material 30 using any number of conformal filling techniques such as, for example, PECVD, ALD or CVD. The top electrode material 32 may be a third metal layer of a same or different material compared to the first and second metal layers. For example, the electrode material may be the material tungsten, aluminum, or copper. The material 32, is deposited with the gaps between the electrodes 18 to form upper surface expansion structures 36.

Figure 11:
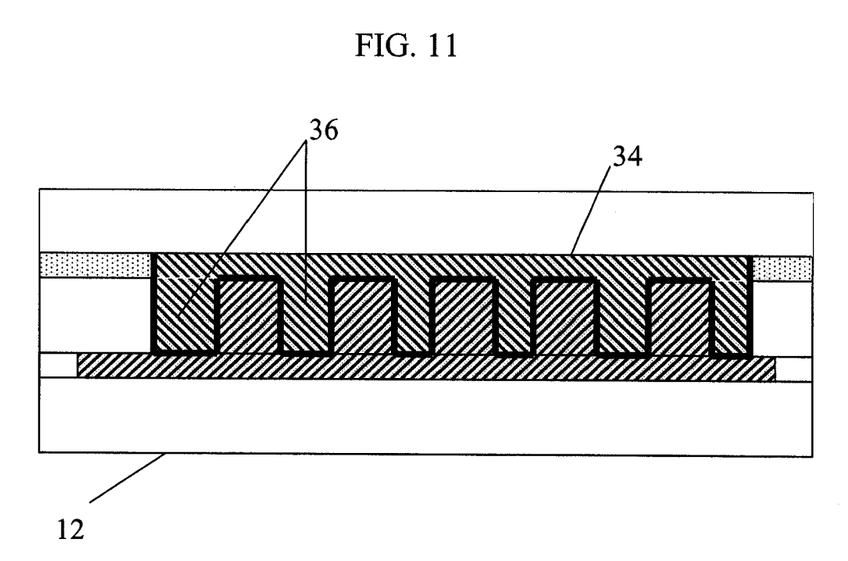

In FIG. 11, chemical-mechanical polishing is used to reduce the top electrode material 32 height to either planar with the top of the polish stop layer 24 or to the top of the ILD layer 14. Alternatively, the chemical-mechanical polishing may also remove the polish stop layer 24. Accordingly, the chemical-mechanical polish is performed to remove excessive metal and stops at the polish stop 24, thus forming a top electrode 34. The upper surface expansion structures 36 are formed below the upper electrode 34, and interleaved or interdigitated with the lower surface expansion structures 18. Thus, the lower surface expansion structures 18 and the upper surface expansion structures 36 are interleaved or interdigitated with one another with the dielectric material 30 therebetween. Additionally, because the interleaved electrodes are interleaved using conformal deposition methods, there is little chance of misalignment between the two sets of surface expansion structures 18, 36.

Figure 12:
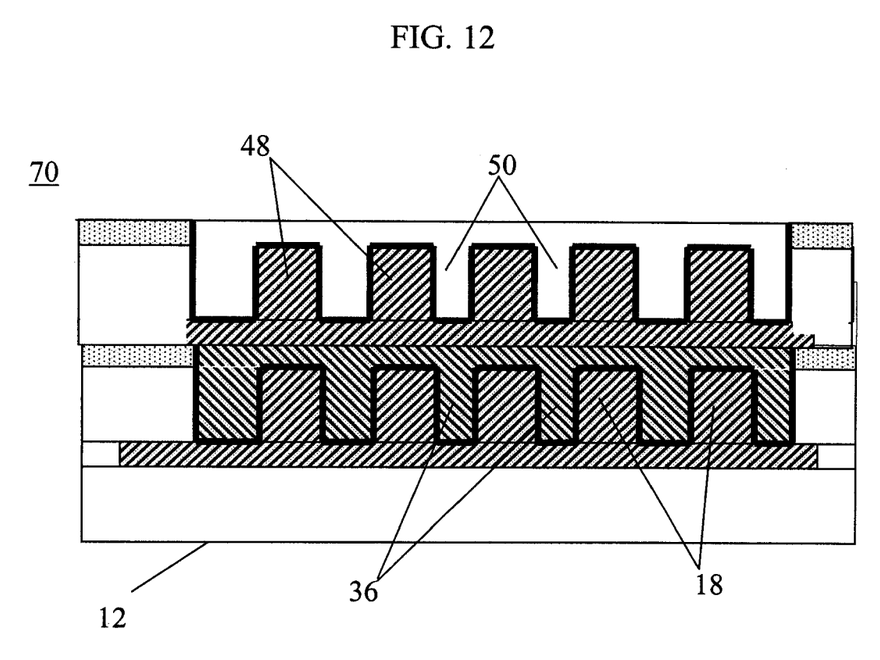
FIG. 12 shows a stacked MIMCAP fabricated in accordance with the invention.

FIG. 12 shows another embodiment including a stacked MIMCAP 70 having layers of interleaved upper and lower surface expansion structures 18, 36, 48 and 50. The stacked MIMCAP 70 may be formed using a fabrication sequence similar to the above steps. Thus, multiple MIMCAPS may be stacked atop one another.

Figure 13:
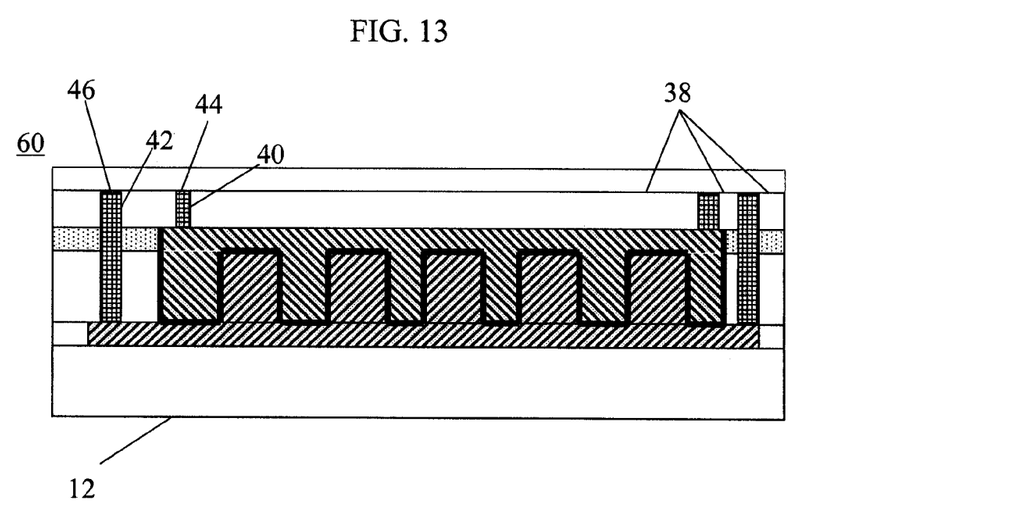
FIG. 13 shows a further fabrication step of a vertical MIMCAP in accordance with the invention.

The remainder of the MIMCAP encapsulation 38 or final insulating material shown in FIG. 13 is deposited and patterned for via 40, 42 connections to the electrodes 10, 34, respectively. The vias can be formed using conventional methods known in the art. Electrical contacts 44 and 46 to the top electrode and bottom electrode, respectively, are formed by deposition methods known in the art. The aspect ratio of the lower surface expansion structures 18 and upper surface expansion structures 36 may be greater than one, and also may be greater than two in embodiments of the invention. However, the invention should not be limited to any aspect ratio.

Figure 14:
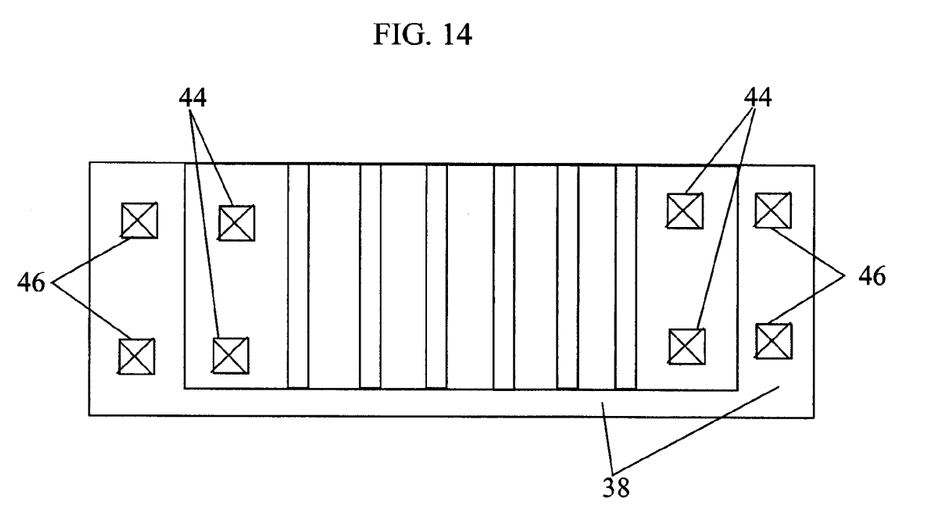
FIG. 14 is a top view of an embodiment of the invention in accordance with FIG. 13.

FIG. 14 shows a top view of FIG. 13. The tops of the electrical contacts 44 and 46 are visible through the encapsulation 38 material in this example. Though a total of four top electrical contacts 44 and four bottom electrical contacts 46 are shown, any number of contacts appropriate to providing sufficient electrical contact to the top and bottom electrodes are contemplated by the invention. Additionally, though the electrical contacts are shown having square cross sections, virtually any cross section suitable for use as contacts are contemplated for use by the invention being only a function of the desired etching process. The contacts may be formed using conductive material including metal, for example.

Figure 15:
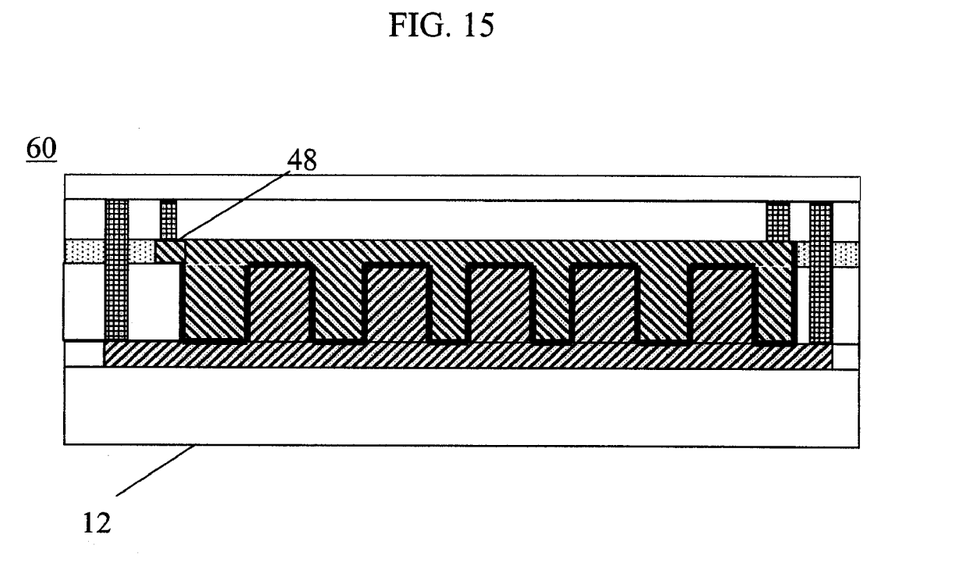
FIG. 15 is a view of an embodiment of the invention.

FIG. 15 shows an alternate embodiment of the invention. In this embodiment, the top electrode 34 includes extensions 48. The extensions 48 may be configured to extend past the edge of the base of the top surface expansion structure. Although FIG. 15 shows a single extension 48 on the top electrode, any number of extensions may be provided, and those extensions may be located in virtually any portion of the conductive components of the MIMCAP. The extensions 48 may serve to provide a contact point for the electrical contacts. The extensions may also serve to reduce fringing effects along the edges of the electrodes. The extensions may be formed by retreating the polish stops 24 to a predetermined position, and then following the steps shown and discussed with reference to FIGS. 8–11, for example.

Figure 18:
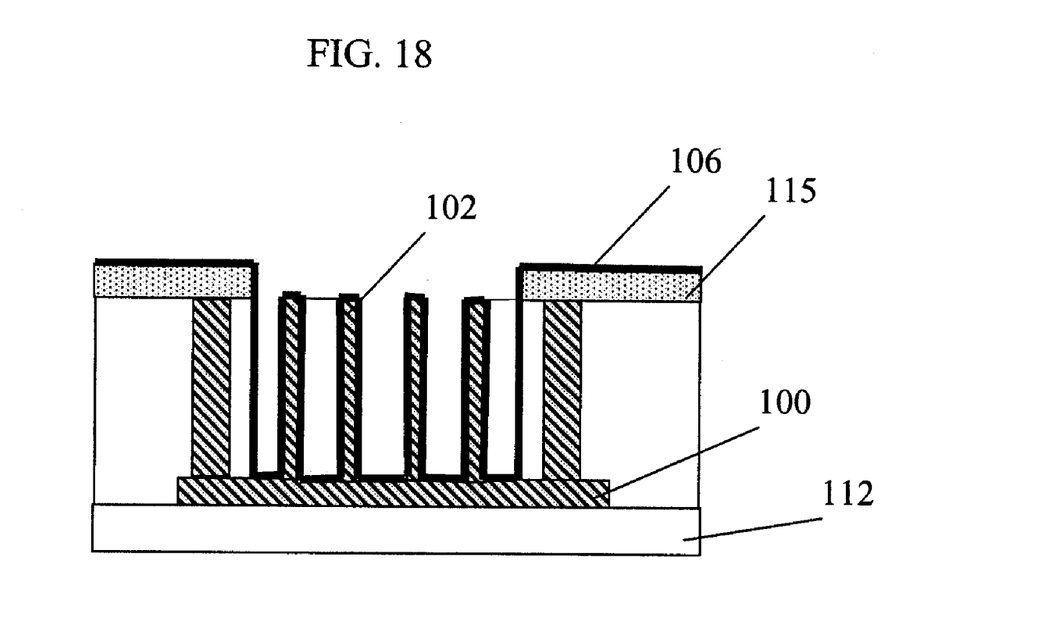
Figure 19:
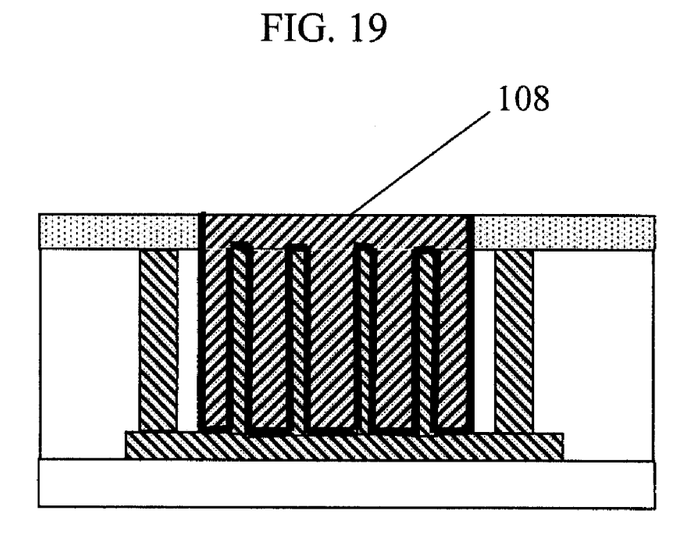
Figure 20:
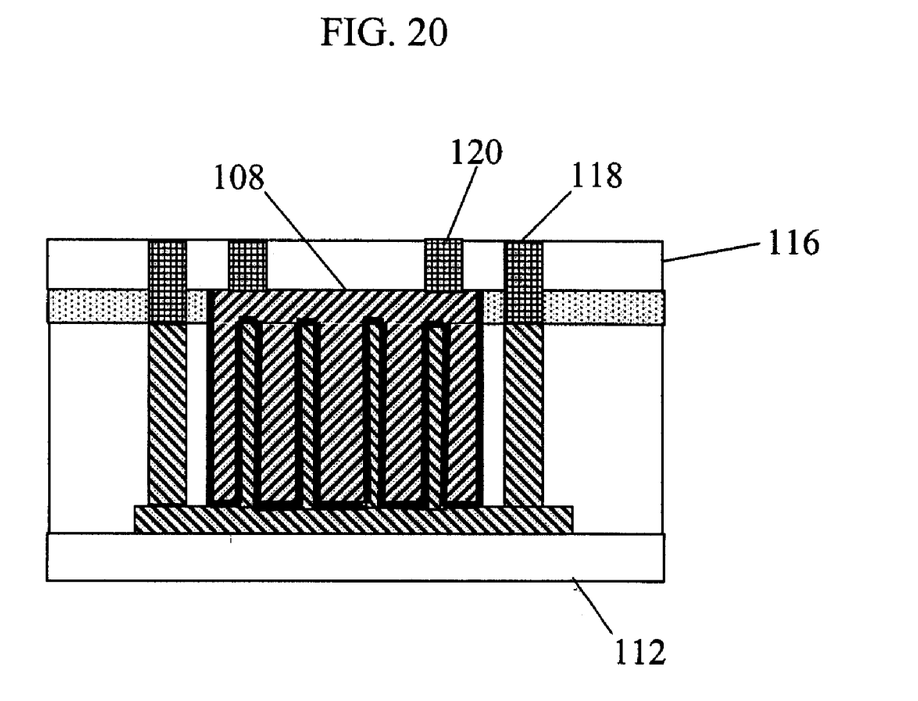
Figure 21:
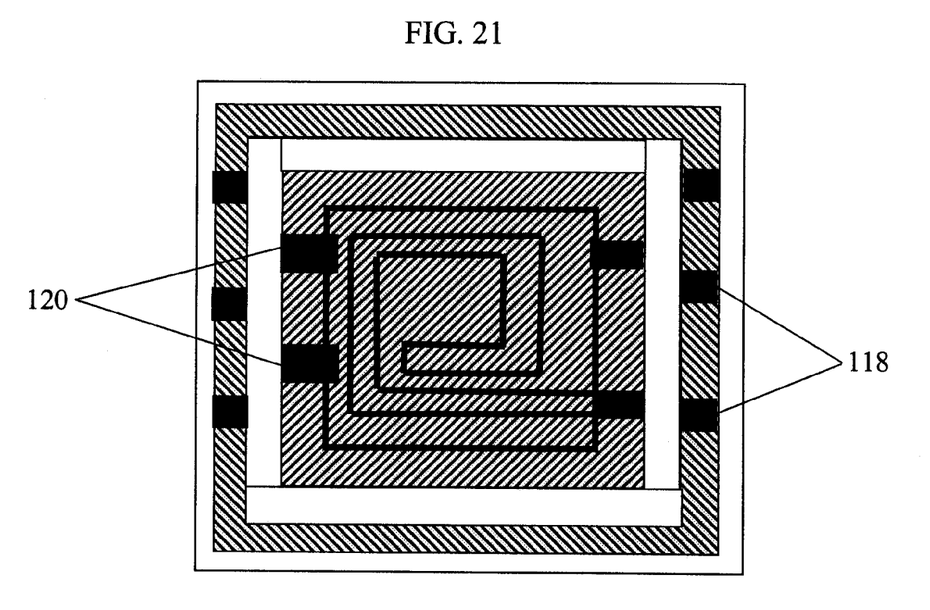
FIG. 21 is a top view of an embodiment of the invention.

Steps to fabricate the alternate embodiment including a spiral electrode MIMCAP is shown in FIG. 16–21. In the embodiment of FIGS. 16–21, the spiral electrode MIMCAP has higher mechanical strength, allowing many MIMCAP units to be easily stacked atop one another. Additionally, a modular concept can be applied to spiral or other unit repeatable structure electrode MIMCAPs, where each module is sized properly, and any number of spiral electrode MIMCAPs modules can be used to create the needed capacitance. Also, spiral electrode MIMCAPs may use a side ring 114 to make contact to the bottom electrode providing simplified electrical access to the bottom electrode. In the spiral electrode MIMCAP, the electrodes are formed in the same manner as the first embodiment, as represented now in FIGS. 16 through 19, with the exception that the electrodes (102 and 108) are formed in a spiral fashion using a photolithographic mask, or a subphotolithographic process. (FIGS. 20 and 21).

Figure 16:
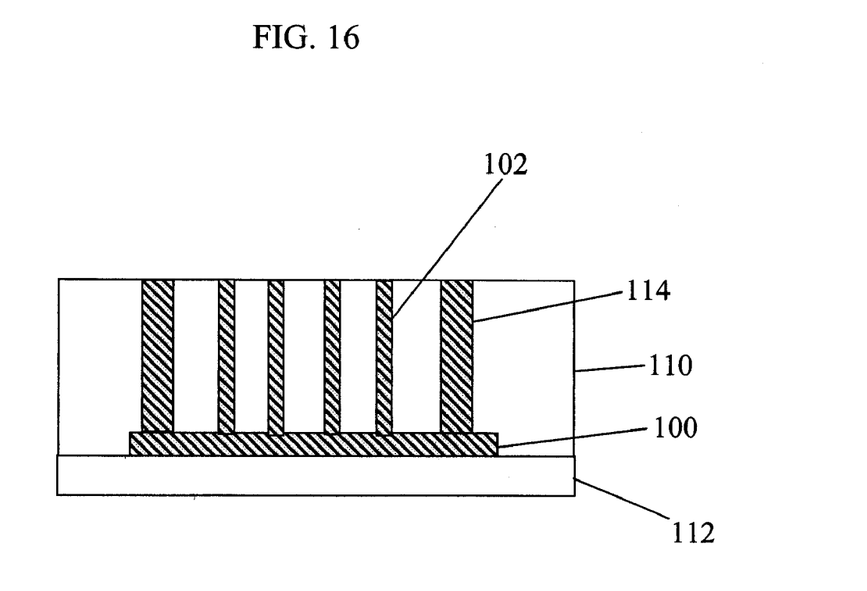
FIGS. 16–20 illustrate steps in fabricating an embodiment of a spiral MIMCAP in accordance with the invention.

Referring to FIG. 16, a substrate 112 having a bottom electrode 100 disposed thereon is formed. Also formed on the substrate 112 is an ILD layer 110. The ILD layer 110 has vias formed therethrough into which conductive material is deposited to form a lower spiral electrode 102. Also formed through the ILD layer 110 is an outer ring 114. The outer ring 114 is in electrical communication with the bottom electrode 100.

Figure 17:
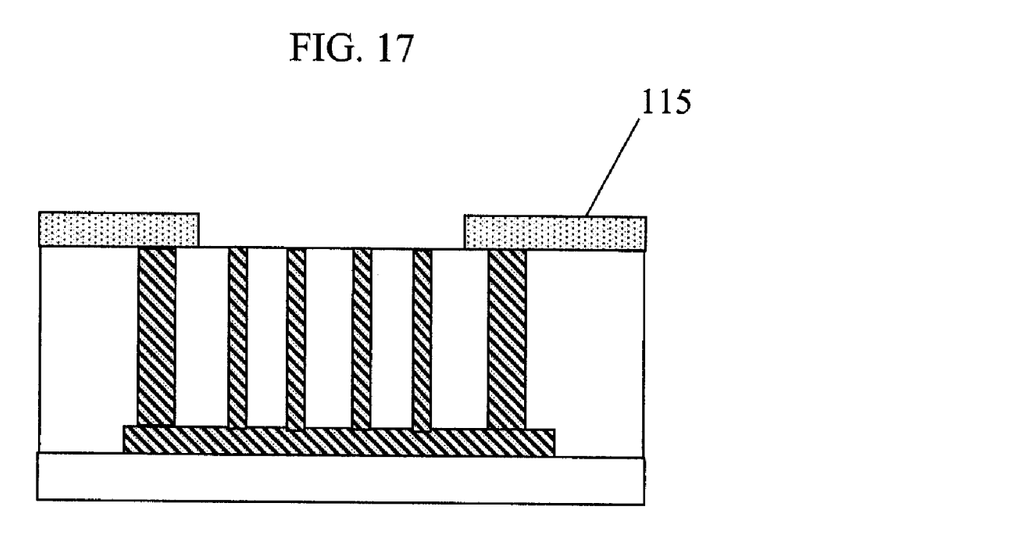

Referring to FIG. 17, polish stops 115 are formed on top of the ILD layer 100 and outer ring 114. The polish stops 115 are configured to leave the bottom spiral electrodes 102 and the central portion of the ILD layer 110 exposed.

Referring to FIG. 18, the ILD layer 114 material between the bottom spiral electrodes 102 and between the bottom spiral electrode 102 and outer ring 114 is removed. A thin layer of insulating material 106 is then conformally deposited over the exposed bottom spiral electrode 102 and polish stops 112. The insulating material 106 is then removed from the top of the polish stops 112. (See FIG. 19.)

Referring to FIG. 19, conductive material is deposited over the insulating material 106 and in the gaps between the bottom spiral electrode 102. The insulating material 106 is thus disposed between the bottom spiral electrode 102 and the conductive material 108. As such, the deposited conductive material now forms the upper spiral electrode 108.

Referring to FIG. 20, an encapsulating material 116 such as, for example, copper, aluminum, tungsten, or any other proper conductive material, is deposited on top of the upper spiral electrode 108 and polished stops 112. Vias are formed through the encapsulation material 116 and electrical contacts 118 and 120 are formed therethrough to the bottom electrode 100 and upper electrode 108, respectively.

Referring to FIG. 21, a top view of the spiral MIMCAP is shown. As is seen, electrical contacts 118 and 120 are visible. Electrical contacts 118 which are in electrical communication with the bottom electrode 100 make electrical contact with the outer ring 114. A total of four upper electrical contacts 120 and six lower electrical contacts 118 are shown. However, any number of upper and/or lower electrical contacts may be formed depending on the desired application. Additionally, the electrical contacts are shown having a square or rectangular cross section, but any other cross section such as circular or triangular may also be used where appropriate.

Figure 22:
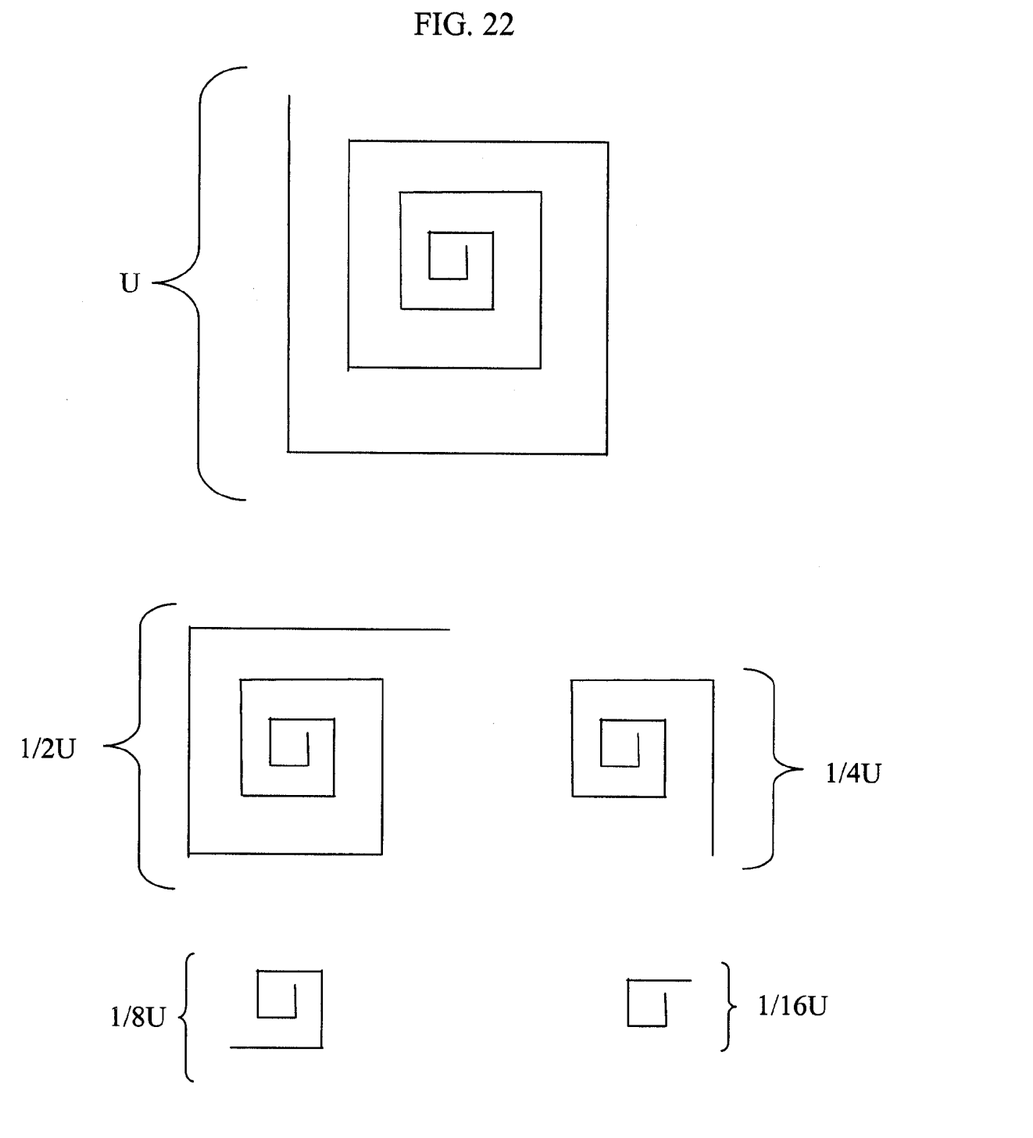
FIG. 22 are schematic diagrams of modular embodiments of the spiral MIMCAP.

The modular concept of MIMCAP is beneficial for ASIC designs. Since the spiral electrode of the MIMCAP can be provided with different sizes, as shown in FIG. 22, for example, one unit or "U" may represent 5 pF. Accordingly, 2 units would represent "2 U" or 2 pF, 4 units would represent "4 U" or 4 pF, and so on, for examples of adding to the capacitor. In a similar fashion, ½ unit would represent "½ U" or 2.5 pF, and ¼ unit would represent "¼ U" or 1.25 pF, ⅛ unit would represent "⅛ U" or 0.62 pF, and so on, for examples subtracting from the capacitor. Other size increments of adjustment or change would also be possible by suitably adjusting the sizes of the section of the capacitor. Thus, a circuit designer can easily call out a wide range of capacitances values by specifying the modular size of MIMCAP. The size of the MIMCAP is modular by the rectangular nature of the spiral electrodes. Thus, each straight length of spiral electrode can be of a predetermined capacitance value. Because each length is nested within other lengths due to the spiral nature, each length is substantially shorter as one moves towards the center of the spiral electrode.

The modular design allows for removing or adding or otherwise changing the number of straight lengths or other segments or sections of spiral electrode to adjust the final capacitance value. Additionally, because the lengths are of different sizes the modularity units are of varying sizes as well, allowing virtually any size of capacitance appropriate for an integrated circuit to be easily specified by the designer. For example, when a design requires 8.75 pF, the designer can pick one 1 unit, one ½ unit, and one ¼ unit. This would save design layout and verification time. This will also guarantee the design accuracy compared to any other conventional method.

While the invention has been described in terms of exemplary embodiments, those skilled in the art will recognize that the invention can be practiced with modifications and in the spirit and scope of the appended claims.

The invention claimed is:

1. A method of fabricating a capacitor, comprising:
   forming a bottom electrode;
   forming at least one lower surface expansion structure on the bottom electrode;
   conformally depositing an insulator film to exposed portions of the bottom electrode and at least one lower surface expansion structure; and
   forming a top electrode having a planar surface with at least one upper surface expansion structure separated from the at least one lower surface expansion structure by the insulator film,
   wherein the at least one lower surface expansion structure and the at least one upper surface expansion structure are vertically arranged.

2. The method of claim 1, wherein forming a top electrode having a planar surface comprises plagiarizing a surface of the top electrode by a polishing process.

3. The method of claim 1, wherein the bottom electrode is capacitively coupled to the top electrode substantially through sides of the at least one lower and upper surface expansion structures.

4. The method of claim 1, further comprising forming multiple lower surface expansion structures in electrical communication with the bottom electrode by:
   forming gaps between the at least one lower surface expansion structures;
   exposing sidewalls of the lower surface expansion structures and portions of the bottom electrode;
   conformally depositing an insulator film on the portions of the bottom electrode and sidewalls of the multiple lower surface expansion structures; and
   forming multiple upper surface expansion structures of the at least one upper surface expansion structure protruding into the gaps and separated from the multiple lower surface expansion structures by the insulator film.

5. The method of claim 4, wherein the multiple lower surface expansion structures are interleaved with the multiple upper surface expansion structures.

6. The method of claim 1, wherein the at least one lower surface expansion structure is a first spiral shape and the at least one upper surface expansion structure is a second spiral shape configured to be interleaved with the first spiral shape.

7. The method of claim 1, further comprising fabricating a second capacitor using the steps of claim 1, and arranging the second capacitor on a top of the capacitor of claim 1.

8. The method of claim 1, further comprising:
   forming another bottom electrode;
   forming at least one other lower surface expansion structure to the other bottom electrode;
   conformally depositing another insulator film to exposed portions of the other bottom electrode and at least one other lower surface expansion structure;
   forming a top electrode without at least one upper surface expansion structure separated from the at least one other lower surface expansion structure by the insulator film.

9. The method of claim 1, wherein the top electrode and the at least one upper surface expansion structures are formed simultaneously.

10. The method of claim 1, wherein the at least one lower surface expansion structure is formed by:
    depositing an interlayer dielectric material on the bottom electrode;
    patterning the interlayer dielectric material to form factors;
    depositing conductor material into the features such that the conductor material is in content with the bottom electrode;
    further patterning the interlayer dielectric material to form gaps between the deposited conductor material.

11. The method of claim 10, wherein the patterning of the interlayer dielectric layer is one of dual tone resist, sidewall image transfer and masking using self-assembled nanocrystals.

12. The method of claim 1, wherein the at least one upper surface expansion structure is interleaved or interdigitated with the at least one lower surface expansion structure.

13. A method of fabricating a capacitor, comprising:
forming a bottom electrode;
forming a lower surface expansion structure on the bottom electrode, the lower surface expansion structure having a plurality of vertically arranged spaced apart portions;
conformally depositing an insulator film to exposed portions of the bottom electrode and the plurality of vertically arranged spaced apart portions of the lower surface expansion structure; and
forming a top electrode having a planar surface with an upper surface expansion structure having a plurality of vertically arranged spaced apart portions,
wherein the upper surface expansion structure is separated from the lower surface expansion structure by the insulator film.

14. The method of claim 13, wherein the plurality of vertically arranged spaced apart portions of the upper surface expansion structure is interleaved or interdigitated with the plurality of vertically arranged spaced apart portions of the lower surface expansion structure.

15. A method of fabricating a capacitor, comprising:
forming a bottom electrode;
forming a first plurality of vertically arranged spaced apart expansion structures on the bottom electrode;
conformally depositing an insulator film to exposed portions of the bottom electrode and the first plurality of vertically arranged spaced apart expansion structures; and
forming a second plurality of vertically arranged spaced apart expansion structures in spaces between the first vertically arranged spaced apart expansion structures;
forming a top electrode having a planar surface on the second plurality of vertically arranged spaced apart expansion structures.

16. The method of claim 15, wherein the first plurality of vertically arranged spaced apart expansion structures is interleaved or interdigitated with the second plurality of vertically arranged spaced apart expansion structures.

* * * * *